ELECTRONIC SWITCH AND CONTROL CIRCUIT THEREFOR

Filed Nov. 19, 1965 2 Sheets-Sheet 1

WITNESSES:
John G. Chopp
James F. Young

INVENTOR
John M. Bentley
BY Dean Schron
ATTORNEY

Sept. 23, 1969 J. M. BENTLEY 3,469,114

ELECTRONIC SWITCH AND CONTROL CIRCUIT THEREFOR

Filed Nov. 19, 1965 2 Sheets-Sheet 2

United States Patent Office 3,469,114
Patented Sept. 23, 1969

3,469,114

ELECTRONIC SWITCH AND CONTROL CIRCUIT THEREFOR

John M. Bentley, Crofton, Md., assignor to Westinghouse Electric Corporation, Pittsburgh, Pa., a corporation of Pennsylvania Filed Nov. 19, 1965, Ser. No. 508,693
Int. Cl. H03k *17/60*
U.S. Cl. 307—254 3 Claims

ABSTRACT OF THE DISCLOSURE

A control circuit for an electronic switch of the type which utilizes two three-electrode semiconductor devices each having a like electrode commonly connected together, a control electrode, and another electrode constituting a switch terminal. Where transistors are utilized, a control circuit is connected between the commonly connected like electrodes, constituting a first point, and the control electrodes, which are commonly connected together, constituting a second point. The control circuit includes a source of potential and a semi-conductor unidirectional current conducting device, in various embodiments including diodes, field effect transistors, and silicon controlled rectifiers. Input circuit means receives input signals for controlling the conduction or non-conduction of the semiconductor unidirectional current conducting device in the control circuit. In another embodiment the electronic switch is comprised of two silicon controlled rectifiers with a silicon controlled rectifier-diode control circuit connected to the control electrodes of the two silicon controlled rectifiers of the switch.

This invention in general relates to electronic switches, and more particularly to control circuits for controlling the state of operation of these electronic switches.

There is a category of electronic switches in which exactness of information transfer is of primary importance. One type of electronic switch which exhibits desirable parameters for performing this transfer includes two transistors having their collectors commonly connected together and their emitters connected to respective first and second switch terminals. A control circuit is connected to the base electrodes of the transisors for controlling the on and off conditions thereof. Such circuits are the subject matter of, and are explained in more detail in Patents 2,891,171—W. Shockley and 2,962,-603—R. L. Bright. One of the switch terminals is connected to a source of electrical potential, either AC or DC, and the other terminal is connected to a load device. Depending upon the control signals applied to the transistors, they will be either non-conducting or conducting bilaterally. In the design of such circuits it is extremely important that the driving signal (generally square wave) be prevented from interacting with and affecting the signal being switched. Additionally, if other potential sources are required for switch operation these other sources must not affect the output. A classical control of such electronic circuits to meet these requriments, include the use of transformers which provide the necessary signal and necessary isolation.

The use of transformers to turn the switches on and off is limited to fairly short on times, since the transformer cannot hold up a square wave indefinitely. To extend the on time the inductance must be increased and this usually results in increased transformer size with a reduction in switching speed.

Accordingly, it is an object of the present invention to provide an improved electronic switch of the class described which eliminates the need for transformer control circuits.

Another object is to provide an electronic switch of the class described in which the control circuit is isolated from the external circuit being controlled.

Another object is to provide an improved electronic switch which will maintain its on condition for an indefinite peroid of time.

Another object is to provide a type of an electronic switch having a control circuit therefor and wherein the need for a constantly applied control signal is eliminated.

Other general objects include the provision of an electronic switch of the class described which allows more than one switch to be capable of operation at any one time, and in which the drive source power requirements are relatively small.

Other objects and advantages will become apparent upon a reading of the following detailed specification taken in conjunction with the drawings.

FIGS. 1 through 7 are schematic circuits of various embodiments and modifications according to the present invention.

Figure 1:
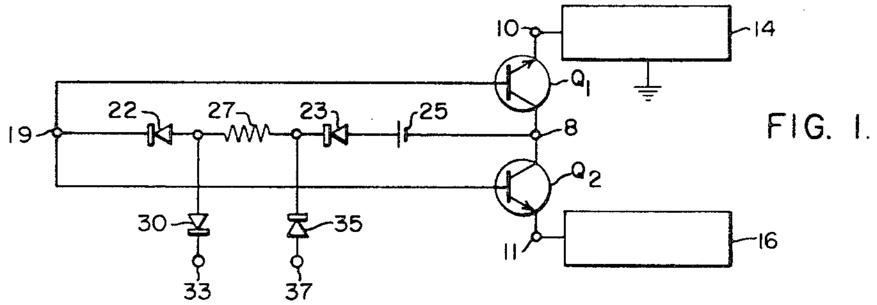

In FIGURE 1 the switch includes transistors Q1 and Q2 having their collector electrodes commonly connected together at a first junction point 8, and their emitters connected to, or constituting, switch terminals 10 and 11. A signal source 14 is connected between ground and the switch terminal 10 and a load device 16 is connected to the switch terminal 11. The bases or control electrodes of transistors Q1 and Q2 are commonly connected together at a second junction point 19. The control circuit for controlling the conduction and non-conduction of transistors Q1 and Q2, that is the on and off condition of the switch, includes a plurality of similarly poled diodes 22 and 23 connected between the first and second junction points 8 and 19. Serially arranged with the diodes 22 and 23 is a potential source 25 and resistance means 27 connected between the anode of diode 22 and the cathode of diode 23.

A first control diode 30 has its anode electrode connected to the anode electrode of diode 22 and its cathode electrode connected to a first input terminal 33 to which is applied bi-valued input control signals. A second control diode 35 has its cathode connected to the cathode of diode 23 and its anode connected to a second input terminal 37 to which is applied oppositely valued signals as those applied to input terminal 33.

With a sufficiently positive potential applied to input terminal 33 and a sufficiently negative potential applied to input terminal 37, diodes 30 and 35 are reversed-biased to a blocked, or non-conducting condition. Base current for transistors Q1 and Q2 is then supplied by potential source 25, through diode 23, resistor 27, and diode 22. The return path for the base current is through the base-collector diodes of the respective transistors. With base current supplied to the transistors, they operate in their on condition, simulating a closed switch wherein the impedance between terminals 10 and 11 is substantially zero. In order that the input diodes remain blocked and do not degrade the signal being switched, the control signals applied to input terminals 33 and 37 should have values greater than the sum of the potential source 25 and the maximum voltage supplied by generator 14.

With positive and negative input control signals applied to input terminals 33 and 37 respectively, the switch between terminals 10 and 11 is in a closed condition with transistor Q1 and Q2 on, and capable of bilaeral conduction. When it is desired to open the switch, transistors Q1 and Q2 are turned off. This is accomplished by applying a negative input control signal to input terminal 33 and simultaneously a positive input control signal to input terminal 37. With these control signals, diodes 30 and 35 are in an unblocked or conducting condition, and provide a certain potential at the cathode of diode 23 and at the anode of diode 22 to back-bias them to a non-conducting condtion. With diodes 22 and 23 back-biased, there is no base current and the transistor switch remains open. The back-biased diode 23 and the collector to base diodes of the transistors isolate the potential source 25 from the external switching circuit.

Figure 2:
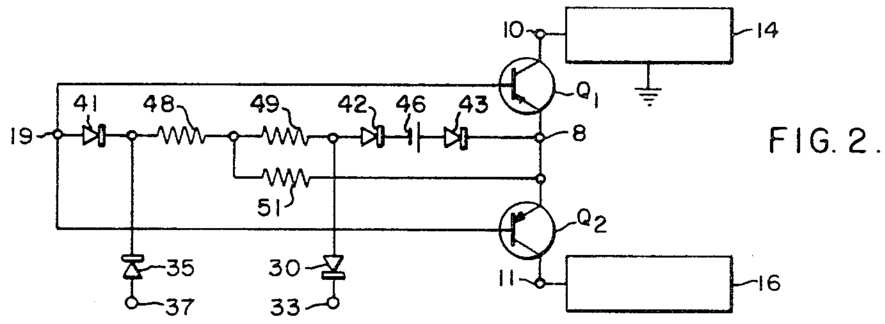

An additional isolation of the potential source may be established by the modification illustrated in FIGURE 2. In FIG. 2 as well as the other figures, like reference numerals are used throughout to designate like components. In FIG. 2 transistosr Q1 and Q2 are shown by way of example, in a common emitter configuration, that is the emitters are commonly connected at first junction point 8 and their collectors are connected to, or constitute, first and second switch terminals 10 and 11. With the emitters connected together, diodes 41, 42 and 43 connected between first junction point 8 and second junction point 19 are poled in the opposite direction to those diodes illustrated in FIG. 1, as is potential source 46. Resistance means 48 and 49 complete the serial arrangement between junction points 8 and 19. With positive and negative input control signals applied to input terminals 33 and 37 respectively, control diodes 30 and 35 are blocked, and transistor base current is allowed to flow thereby closing the switch between switch terminals 10 and 11. To open the switch, a positive control signal is applied to input terminal 37 and a negative control signal is applied to input terminal 33 thereby establishing a blocking potential at the cathode of diode 41 and at the anode of the diode 42. To additionally isolate the potential source 46 from the external circuit, there is provided the diode 43 which has its cathode supplied with a reverse-bias potential by virtue of the feedback connection of resistor 51 connected to the junction between resistors 48 and 49, for applying the potential thereat to the cathode of diode 43. The potential at the junction between resistors 48 and 49 is governed by the respective values of these resistors.

Figure 3:
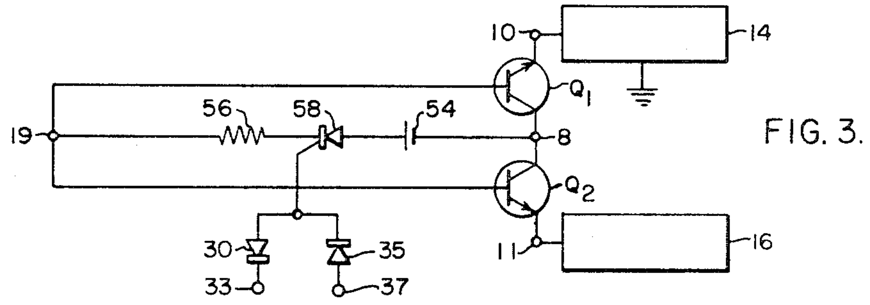

In FIGS. 1 and 2 the bi-valued input control signals may be supplied by logic circuitry such as a bistable multivibrator. In the circuit of FIG. 3 the on and off condition of commonly connected transistors Q1 and Q2 is governed by pulse control. More specifically, the control circuit between the first and second junction points 8 and 19 includes potential source 54 and resistance means 56 in serial arrangement with a controlled rectifier device 58 such as silicon controlled rectifier (SCR) 58 having an anode, cathode and control electrode. First control diode 30 has its anode connected to the control electrode of the controlled rectifier 58 and second control diode 35 has its cathode connected thereto. Back-biasing potentials are applied to input terminals 33 and 37 to keep control diodes 30 and 35 in a back-biased position. In order to insure that this biasing potential will not interfere with the operation of the switch, they should be of a potential greater than the sum of potential source 54 and the maximum voltage of generator 14.

To turn the transistors on, a positive pulse is applied to input terminal 37 and is of a value greater than the bias potential to that terminal. Control diode 35 passes the positive pulse to the control electrode of controlled rectifier 58 to thereby bring it into conduction, thus allowing base current to flow. With the removal of the control pulse the controlled rectifier still remains in a conducting condition and the switch between terminals 10 and 11 is closed (diodes Q1 ad Q2 conducting). In order to open the switch (transistors Q1 and Q2 non-conducting) a negative pulse is applied to input terminals 33, the pulse being greater than the biasing potential at the terminal. The arrangement of FIG. 3 provides for self-latching since once the controlled rectifier 58 is pulsed on it will stay on until pulsed off.

Figure 4:
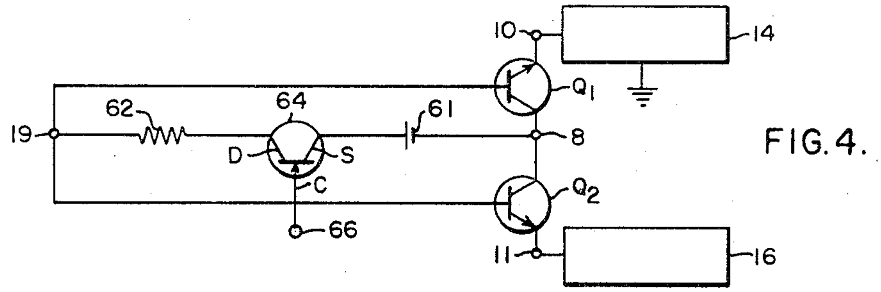

In FIG. 4 the control circuitry between junction points 8 and 19 include, in addition to potential source 61 ad resistance means 62, a field effect transistor (FET) 64 having a drain electrode D, a source electrode S and a control electrode C. The source-drain current path is connected in serial fashion with the potential source 61 and the resistance means 62, and the control electrode is connected to input terminal 66 to which is applied control signals for controlling the conduction and non-conduction of field effect transistor 64. With a zero or positive potential control signal applied to input terminal 66, a current path is established from the source to the drain electrode, base current for transistors Q1 and Q2 will be provided, and the switch between terminals 10 and 11 will be closed. The switch may be opened by the application of a negative control signal to the input 66. The field effect transistor 64 has a very high input impedance and its output is isolated from its input, and provides the necessary isolation between the signal being controlled by the transistors Q1 and Q2 and the input gating or control signal. Pulse control gating of the circuit of FIG. 4 may be accomplished by the addition of components illustrated in FIG.5. .

Figure 5:
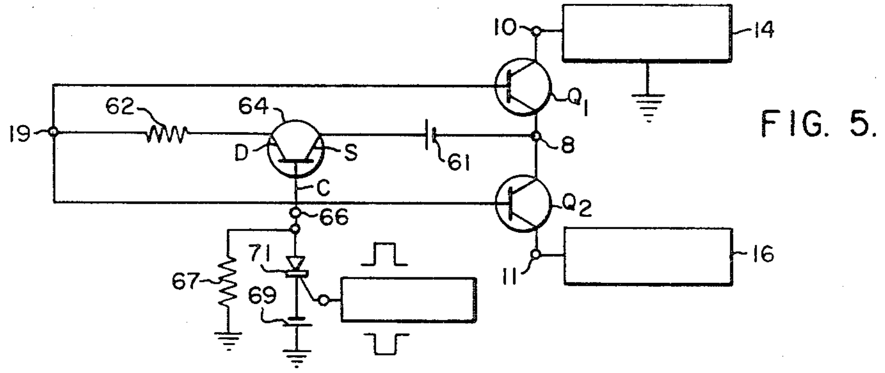

In FIG. 5 the input terminal 66 is connected to ground potential through resistance means 67. The terminal is additionally connected to a source of negative bias potential 69 through controlled rectifier 71 having a control electrode adapted to be supplied with both positive and negative control pulses. With the controlled rectifier 71 in a non-conducting condition, essentially ground potential is applied to the input terminal 66, connected to the control electrode of the field effect transistor 64, placing it into a conducting condition thereby completing the base current circuit for transistors Q1 and Q2. With a positive pulse applied to the control electrode of the controlled rectifier 71, turning on takes place and the negative potential of source 69 is applied at input terminal 66 to the control electrode of the field effect transistor 64 thereby rendering it non-conducting and turning off transistors Q1 and Q2. To again establish a closed switch between switch terminals 10 and 11, a negative pulse is applied to the control electrode of controlled rectifier 71 to turn it off so that input terminal 66 is again essentially grounded.

Figure 6:
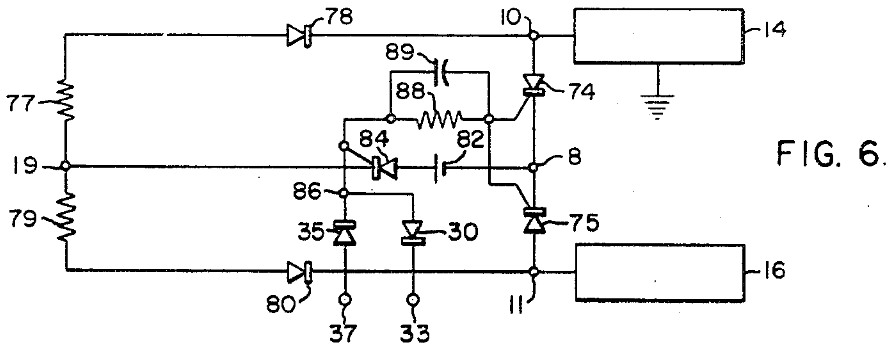
Figure 7:
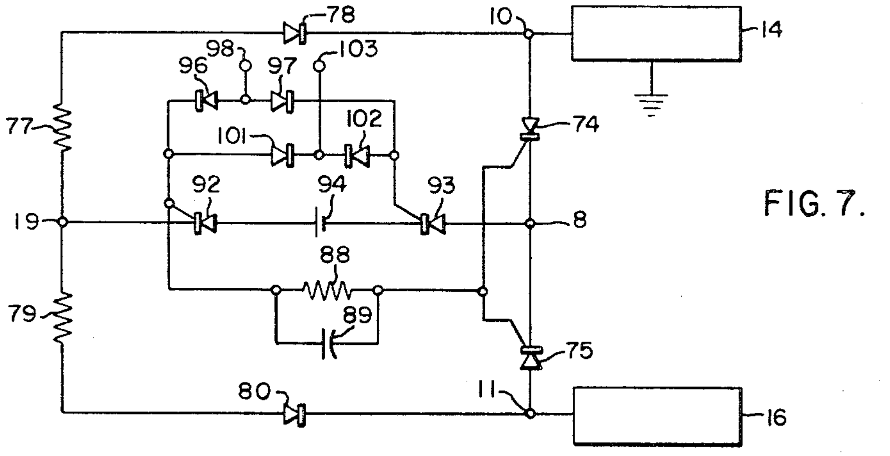

FIG. 6 illustrates a modification of the present invention wherein somewhat larger currents may be supported between switch terminals 10 and 11. The circuit of FIG. 6 includes controlled rectifiers 74 and 75 each having a like electrode, the cathode electrode connected together at a first junction point 8 and another electrode, the anode, connected to respective switch terminals 10 and 11. As was the case with transistors Q1 and Q2, the controlled rectifiers 74 and 75 may be reversed, with a corresponding reversal of other diodes and polarities.

First balancing resistor 77 and first diode 78 are serially connected between the second junction point 19 and the switch terminal 10. A second balancing resistor 79 is serially connected with a second diode 80 between the second junction point 19 and the second switch terminal 11. Biasing means including potential source 82 is serially connected with a third controlled rectifier device 84 between the first and second junction points 8 and 19.

First control diode 30 has its anode connected to input junction point 86 and its cathode connected to first input terminal 33, and second control diode 35 has its cathode connected to the same input junction point 86 and its anode connected to second input terminal 37. Respective back-biasing potentials are applied to first and second input terminals 33 and 37 in a manner similar to that explained with respect to FIG. 3.

Means are included to connect the control electrode of the first, second and third controlled rectifiers 74, 75 and 84 to the input junction point. For the first and second controlled rectifiers 74 and 75, this includes a speed-up mechanism of resistor 88 and speed-up capacitor 89, and for the third controlled rectifier 84 a direct connection is made from its control electrode to the input junction point 86.

To close the switch between switch terminals 10 and 11, that is turn on the controlled rectifiers 74 and 75, a sufficiently positive pulse is applied to the input terminal 37 and this pulse forward biases the third controlled rectifier 84 to place it into a conducting condition. The same pulse is also applied to the control electrodes of controlled rectifiers 74 and 75 to place them into a conducting condition and the controlled rectifiers remain in a conducting condition by the potential source 82. The switch will remain closed between terminals 10 and 11 until a sufficiently negative pulse is applied to input terminal 33, the negative pulse causing input junction point 86 to become sufficiently negative to turn off the controlled rectifier devices.

Normally, in the arrangement of FIG. 6 potential source 82 is sufficiently isolated when the switch is turned off. However, for applications where even more positive isolation is desired, the circuit of FIGURE 7 finds application. In addition to the first and second controlled rectifiers 74 and 75, FIGURE 7 includes a third and fourth controlled rectifier device 92 and 93 connected between first and second junction points 8 and 19 and in serial arrangement with the potential source 94.

First and second control diodes 96 and 97 have their cathodes connected to the control electrodes of controlled rectifiers 92 and 93 respectively, and their anodes connected together. First input terminal 98 is connected to the anodes of first and second control diodes 96 and 97 for receiving input control signals. Third and fourth control diodes 101 and 102 each have an anode connected to a respective one of the control electrodes of controlled rectifiers 92 and 93, and their cathodes connected together. A second input terminal 103 is connected to the commonly connected cathodes for receiving input control signals. The control electrodes of controlled rectifiers 74 and 75 are connected through speedup means to the control electrode of controlled rectifier 92.

To close the switch between switch terminals 10 and 11 a positive control signal is applied to the first input terminal 98 to turn on all of the controlled rectifiers which may again be turned off by the application of a negative control signal to the second input terminal 103.

Accordingly there has been provided an improved electronic switch including first and second serially connected semiconductor devices each having a first electrode connected to a first electrode of the other device and a second electrode connected to, or constituting, a switch terminal. Control circuit means includes at least one unidirectional current conducting third semiconductor device for controlling the conduction and non-conduction of the first and second semiconductor devices. Input terminal means receive external control signals for governing the conduction of the third semiconductor device.

Although the present invention has been described with a certain degree of particularity it is to be understood that various modifications may be made thereto in the light of the above teachings.

What is claimed is:

1. An electronic switch comprising:

(A) first and second serially connected semiconductor transistors,
  (1) each including a collector and emitter electrode with one of said electrodes of said first transistor being commonly connected with a like electrode of said second transistor at a first junction point,
  (2) the unconnected electrodes constituting first and second switch terminals,
  (3) each said transistor additionally including a base electrode commonly connected at a second junction point;

(B) a control circuit connected between said first and second junction points and including the serial arrangement of
  (1) a potential source,
  (2) a plurality of similarly poled diodes, and
  (3) resistance means interposed between at least two of said diodes;

(C) a first input terminal for receiving bi-valued control signals;

(D) a second input terminal for receiving bi-valued control signals;

(E) a first control diode having its anode electrode connected to an anode electrode of one of said serially arranged diodes and its cathode electrode connected to said first input terminal; and (F) a second control diode having its cathode electrode connected to a cathode electrode of another of said serially arranged diodes and its anode electrode connected to said second input terminal.

2. A circuit according to claim 1 which has, in the control circuit, only two diodes with resistance means between them for governing the voltage at the anode of one and the voltage at the cathode of the other diode in their non-conducting state.

3. A circuit according to claim 1 wherein:

(A) the control circuit includes three similarly poled diodes with the resistance means being interposed between the first and second of said diodes and the potential source being interposed between the second and third of said diodes; and additionally includes (B) other resistance means connected between an electrode of the third of said diodes and a point intermediate said resistance means.

References Cited

UNITED STATES PATENTS

| | | | |
|---|---|---|---|
| 2,899,571 | 8/1959 | Myers | 307—253 |
| 3,253,161 | 5/1966 | Owen | 307—254 X |

DONALD D. FORRER, Primary Examiner

U.S. Cl. X.R.

307—252, 253